United States Patent
Calderone et al.

(10) Patent No.: US 6,480,703 B1
(45) Date of Patent: Nov. 12, 2002

(54) COMMON CARRIER, MULTIPLE OUTPUT RF UPCONVERTER

(75) Inventors: Theodore Calderone, San Carlos, CA (US); Mark J. Foster, Palo Alto, CA (US)

(73) Assignee: Agile TV Corporation, Menlo Park, CA (US)

( * ) Notice: Subject to any disclaimer, the term of this patent is extended or adjusted under 35 U.S.C. 154(b) by 9 days.

(21) Appl. No.: 09/708,315

(22) Filed: Nov. 7, 2000

(51) Int. Cl.[7] ............................................... H04B 1/02
(52) U.S. Cl. ........................ 455/118; 455/105; 348/723; 725/149
(58) Field of Search ............................ 455/73, 76, 91, 455/103, 105, 114, 118, 125, 550, 318, 319, 333, 12.1; 725/144, 148, 149; 348/723, 724; 333/17.1, 24 R, 157; 342/165

(56) References Cited

U.S. PATENT DOCUMENTS

| | | | | |
|---|---|---|---|---|
| 5,315,304 A | * | 5/1994 | Ghaleb et al. | 342/165 |
| 5,323,064 A | * | 6/1994 | Bacon et al. | 455/333 |
| 5,420,552 A | * | 5/1995 | Sakka | 455/125 |
| 6,100,841 A | * | 8/2000 | Toth et al. | 342/165 |
| 6,108,565 A | * | 8/2000 | Scherzer | 455/550 |
| 6,115,584 A | * | 9/2000 | Tait et al. | 455/73 |

* cited by examiner

Primary Examiner—Lester G. Kincaid
(74) Attorney, Agent, or Firm—Michael A. Glenn

(57) ABSTRACT

The invention provides a mechanism for implementing a common carrier, multiple output RF upconverter. The preferred embodiment of the invention comprises a method and apparatus for distributing the LO signals for both the first and second LO functions to several upconverter sections simultaneously. This technique eliminates the frequency synthesizers and VCOs typically required for each individual upconverter section, thereby substantially reducing the board space and component count required to perform this function. By providing a distributed LO, only two LO synthesizers and VCO's are required per board, where a board might support anywhere from two to twelve or more upconverters.

22 Claims, 4 Drawing Sheets

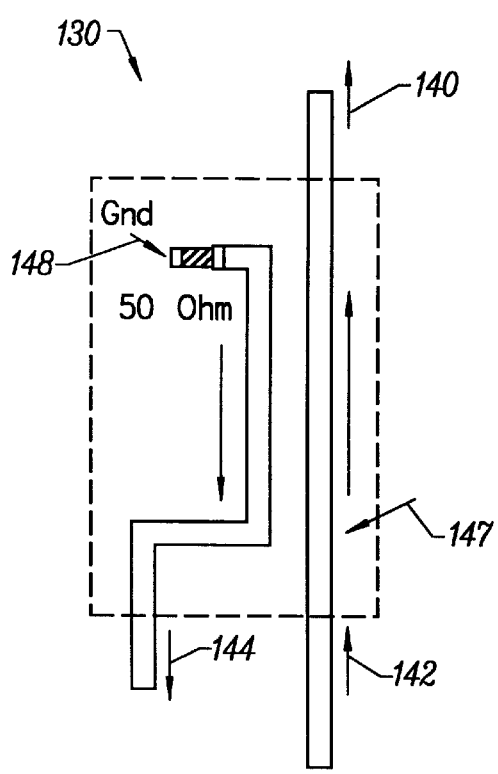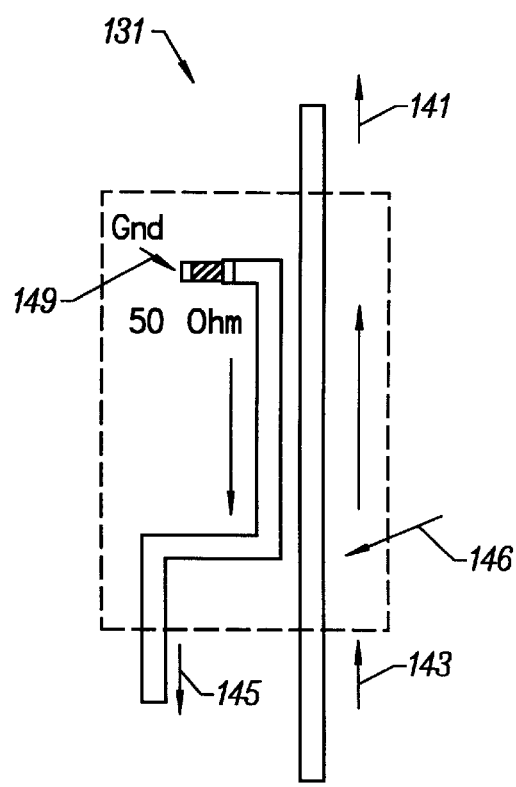
FIG. 4                    FIG. 5

US 6,480,703 B1

COMMON CARRIER, MULTIPLE OUTPUT RF UPCONVERTER

BACKGROUND OF THE INVENTION

1. Technical Field

The invention relates to frequency conversion, for example for cable television applications. More particularly, the invention relates to a common carrier, multiple output RF upconverter.

2. Description of the Prior Art

FIG. 1 is a block schematic diagram showing a conventional multiple carrier, multiple output RF upconverter. A typical frequency agile RF upconverter designed for cable television (CATV) applications uses a dual frequency conversion process in which a first local oscillator (LO) 10 typically operates at a fixed frequency in the range from 900 MHz to 1100 MHz and a second LO 12 operates in the range from 1 to 2 GHz, depending on the desired output frequency range.

The RF upconversion process actually incorporates an upconversion step and a downconversion step to attain the desired frequency range and elimination of in Band spurious response. The first LO, in conjunction with a first mixer 13, upconverts an incoming 44 MHz intermediate frequency (IF) signal 14 to a new, higher IF frequency, typically in the range from 950 MHz to 1150 MHz. This signal is then bandpass filtered 16 to remove the unwanted carrier generated by the mixing process. The filtered high/IF is then sent on to the next mixing stage 18 where it is downconverted to a frequency in the CATV spectrum ranging from 50 to 860 MHz.

In a frequency agile upconverter, the second LO, which is comprised of a wide bandwidth voltage controlled oscillator (VCO), provides the frequency setting agility to span the 50 to 860 MHz frequency range mentioned above.

Both the first and second LOs require high stability frequency synthesizers to meet phase noise, frequency stability, and frequency setability requirements. A substantial portion of the circuitry in the typical upconverter is dedicated to the support and operation of the first and second LO synthesizers.

For specific applications in CATV that require a common frequency but with multiple RF outputs, such as broadcasting node specific video content or data over multiple nodes using a fixed channel frequency, the current practice is to rely on an individual RF modulator/upconverter for each node, e.g. Chan#1, Chan#, Chan#3, . . . , Chan#N. Using individual modulators/upconverters can consume a large amount of equipment rack space. For most CATV headends, space is scarce.

It would be advantageous to provide a mechanism for substantially reducing the board space and component count normally required to perform the modulation/upconversion function.

SUMMARY OF THE INVENTION

The invention provides a mechanism for implementing a common carrier, multiple output RF upconverter. The preferred embodiment of the invention comprises a method and apparatus for distributing the LO signals for both the first and second LO functions to several upconverter sections simultaneously. This technique eliminates the frequency synthesizers and VCOs and associated circuitry typically required for each individual upconverter section, thereby substantially reducing the board space and component count required to perform this function. By providing a distributed LO, only two LO synthesizers and VCO's are required per board, where a board might support anywhere from two to twelve or more upconverters.

BRIEF DESCRIPTION OF THE DRAWINGS

FIG. 4 is a schematic diagram of a copper trace for a first directional coupler according to the invention; and FIG. 5 is a schematic diagram of a copper trace for a second directional coupler according to the invention.

DETAILED DESCRIPTION OF THE INVENTION

The invention provides a mechanism for implementing a common carrier, multiple output RF upconverter. The preferred embodiment of the invention comprises a method and apparatus for distributing the LO signals for both the first and second LO functions to several upconverter sections simultaneously. This technique eliminates the frequency synthesizers and VCOs typically required for each individual upconverter section, thereby substantially reducing the board space and component count required to perform this function. By providing a distributed LO, only two LO synthesizers and VCO's are required per board, where a board might support anywhere from two to twelve or more upconverters.

There are two embodiments of the invention disclosed herein for distributing both LO signals to each upconverter section.

Figure 2:
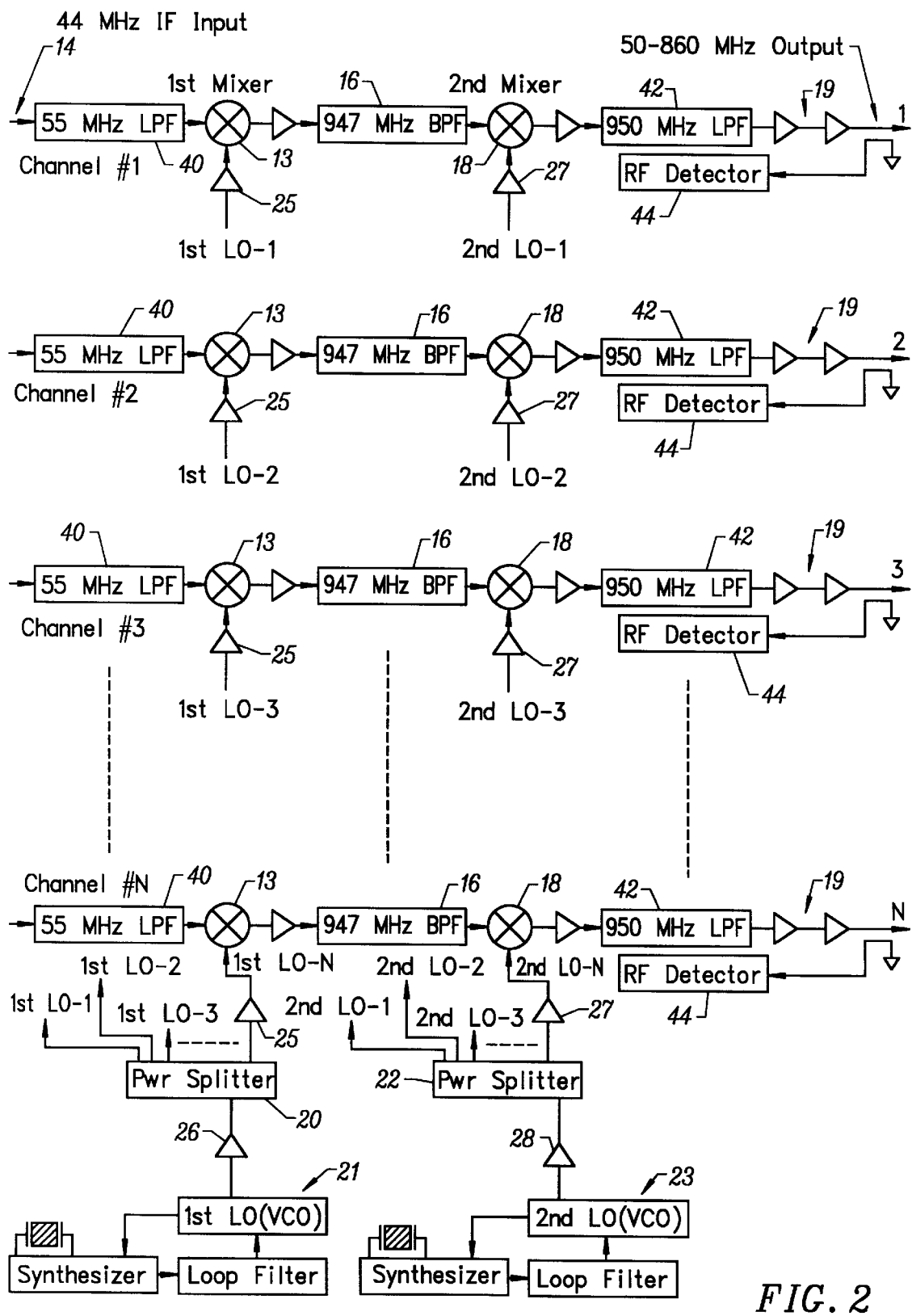
FIG. 2 is a block schematic diagram showing a common carrier, multiple output RF upconverter that uses a power splitter according to the invention.

FIG. 2 is a block schematic diagram showing a common carrier, multiple output RF upconverter that uses a power splitter 20, 22 according to the invention. This first embodiment uses a conventional mechanism for splitting RF signals, respectively, from a common first LO 21 and second LO 23, which comprises the power splitters 20, 22, where the RF output of each tap on each power splitter is fed to the respective upconverter sections, to supply the appropriate LO signal thereto.

Figure 3:
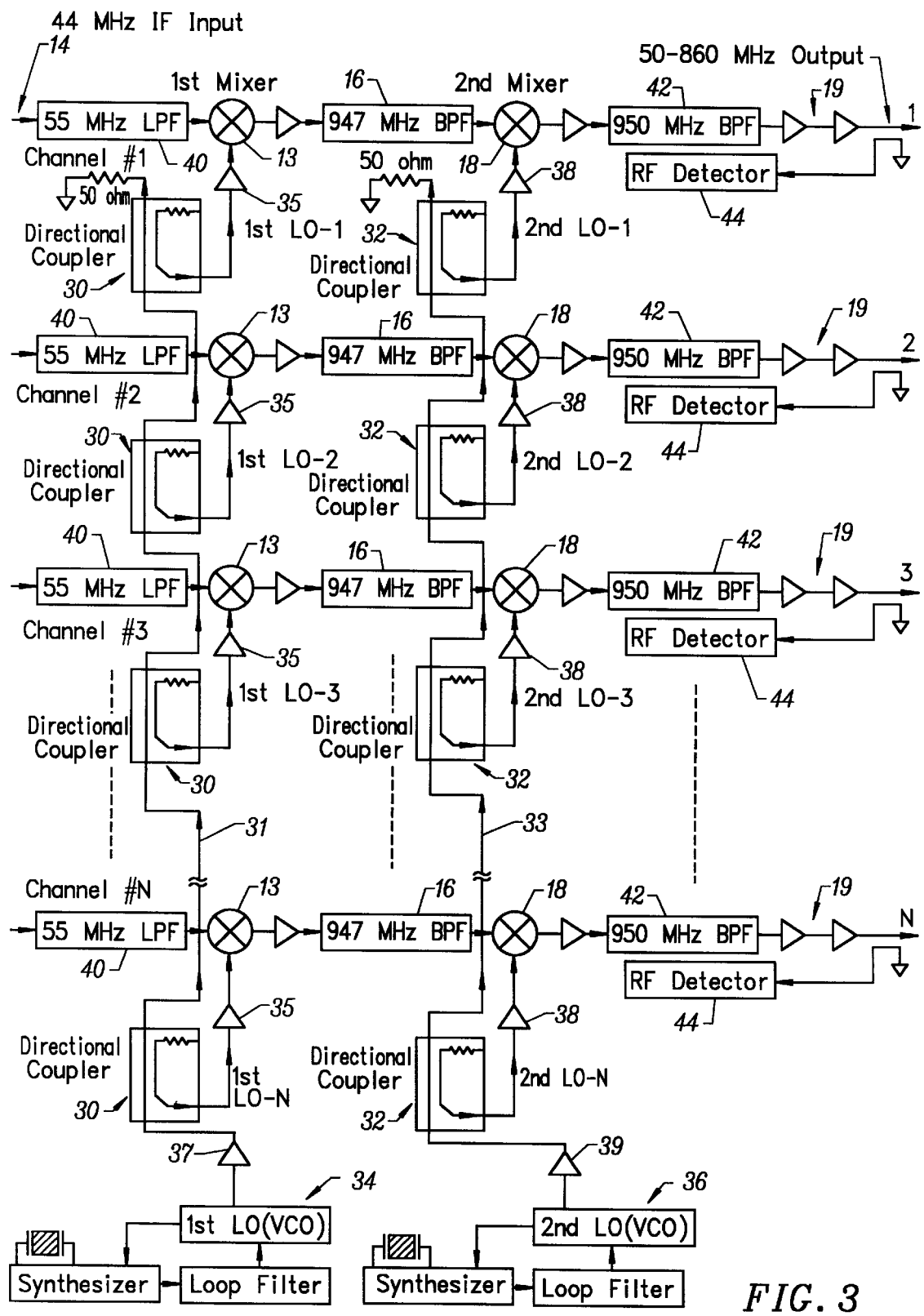
FIG. 3 is a block schematic diagram showing a common carrier, multiple output RF upconverter that uses directional couplers according to the invention.

FIG. 3 is a block schematic diagram showing a common carrier, multiple output RF upconverter that uses directional couplers according to the invention. This second embodiment uses a distributive signal splitting scheme comprised of a series of hybrid directional couplers 30, 32 that are equally spaced along a signal distribution path 31, 33. A common first LO 34 and second LO 36 each generate a signal that is routed along the respective path 31, 33. The signal from the tap of each coupler is then fed to the LO input of each upconverter section, e.g. respective first mixer 13 and second mixer 18. At the 950 to 1100 MHz LO frequencies mentioned above, a directional coupler can be implemented by simply using circuit board traces in a specific geometric pattern (see FIG. 4 and 5), thus eliminating the need for physical components.

FIGS. 4 and 5 are schematic diagrams that show copper traces 146, 147 for a directional coupler 130, 131 according to the invention. FIG. 4 shows a coupler 130 having a high coupling ratio and low tapped output level; FIG. 5 shows a coupler 131 having a low coupling ration and high tapped output level. Each coupler receives an RF input 142, 143 and provides an RF output 140, 141 and a tapped signal 144, 145. Each tap is grounded 148, 149 in FIGS. 4 and 5, the properties of the couplers are shown to be a function of the spacing of the tap from the RF tracing. Other approaches may be used in connection with the invention, or discrete components may be used as couplers.

Both embodiments mentioned above require that the LO signals from the splitters or the directional couplers undergo amplification at an amplifier stage 26, 28; 37, 39 immediately after splitting to raise the signal to a useful level. This task is easily performed using a common monolithic microwave integrated circuit (MMIC), such as the RF2312, manufactured by RF MicroDevices of Greensboro, N.C.

The LO signal levels that are fed to the mixers are adjusted through the use of resistive attenuators 25, 27; 35, 38 to accommodate the LO drive level specified by the mixer manufacturer. For passive type mixers, such as the ADE -25-, manufactured by Mini-Circuits Labratory of Brooklyn, N.Y., the LO drive levels range from +13 dBm to +17 dBm. For active mixers, such as a Gilbert Cell based devices, manufactured by Anadigics, Inc., of Warren, N.J., the LO drive levels vary widely according to the configuration of the mixer. Many Gilbert Cell type mixers incorporate an LO amplifier, therefore, requiring very low LO drive levels, typically in the range from −10 dBm to +2 dBm.

DETAILED DESCRIPTION OF OPERATION

Figure 1:
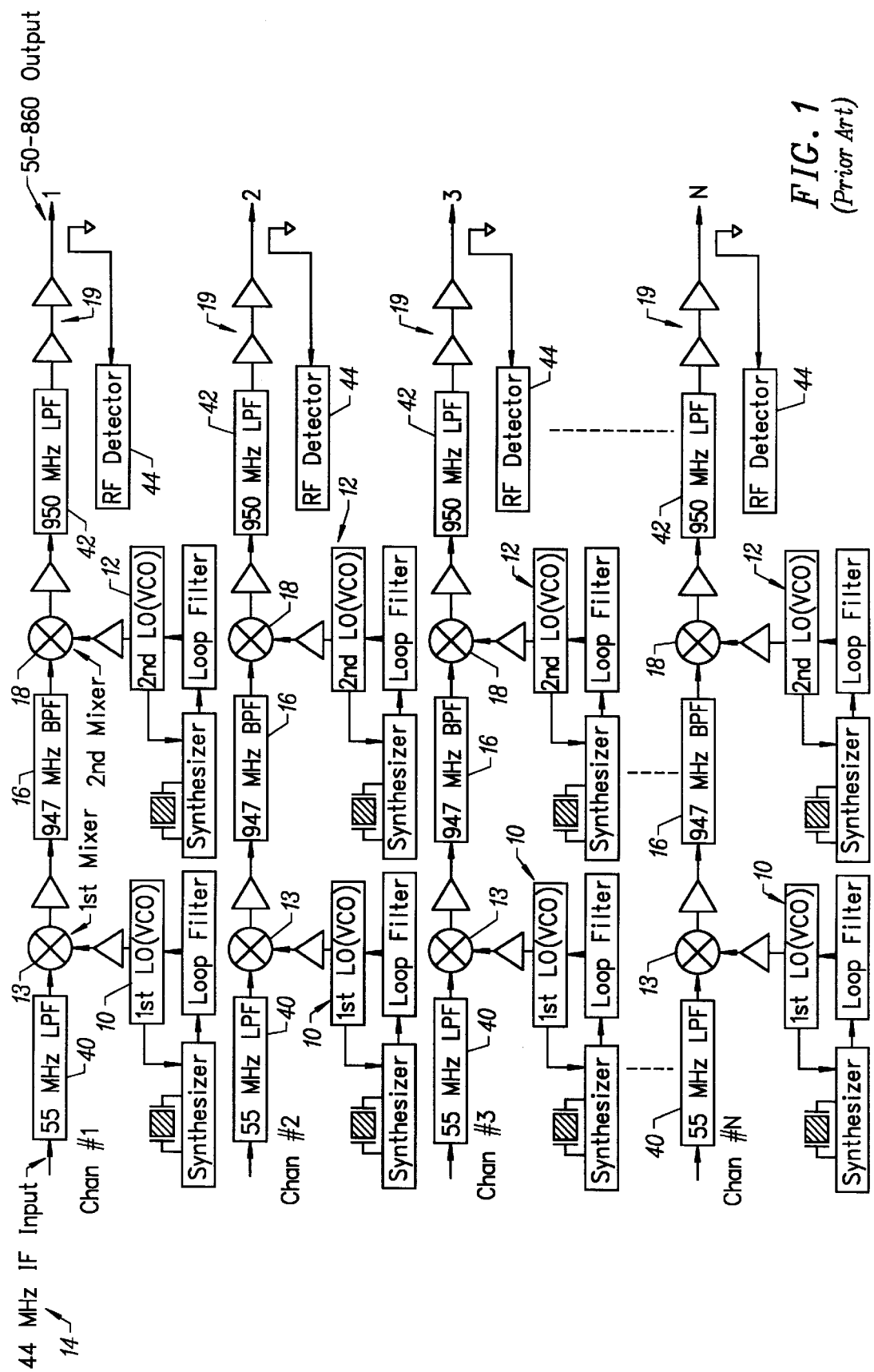
FIG. 1 is a block schematic diagram showing a conventional multiple carrier, multiple output RF upconverter.

The operation of the common carrier, multiple output upconverter described herein is essentially the same for almost any dual conversion, CATV type RF upconverter (see FIG. 1). The common carrier, multiple output type upconverter is designed for a very specific type of CATV application, which sets it apart from the conventional CATV upconverter in that, typically, conventional upconverters are set up to output a separate carrier frequency for each upconverter unit when used to support a typical frequency division multiplexing (FDM) scheme. In contrast, a common carrier, multiple output upconverter outputs the same frequency for each upconverter unit.

The IF input to the common carrier, multiple output upconverter can be either a 44 MHz or a 43.75 MHz (center frequency) IF. The bandwidth of the IF is typically 6 MHz for domestic U.S. applications or 7 to 8 MHz for international applications. The 55 MHz low pass filter 40 serves two functions: it removes any second or third order harmonics generated in the amplifier chain or digital-to-analog (D/A) converter as in the case of QAM modulation; and it serves as a de-glitching filter for applications that use a D/A converter to generate the 44 MHz IF, such as a QAM modulator.

The filtered 44 MHz IF at the output of the 55 MHz filter is then fed to the RF input of the first mixer 13 where it is mixed with the signal from the first LO. For illustration purposes assume the frequency of the first LO is 903 MHz. The output of the first mixer is a product containing an upper and lower sideband around this LO frequency. These sidebands, which are located at 44 MHz above and 44 MHz below the 903 MHz LO frequency are amplified and fed to the 947 MHz bandpass filter 16. The 947 MHz bandpass filter passes the 903+44 MHz (947 MHz) upper sideband and rejects the 903−44 MHz (859 MHz) lower sideband.

The filtered output from the 947 MHz filter is fed into the RF input of the second mixer 18 where it is mixed with the signal from the second LO. The second LO is a wide bandwidth VCO controlled by a frequency synthesizer. he second LO operates from 1.0 GHz to a little over 1.8 GHz, typically with a frequency step size of 250 kHz. The output from the second mixer contains several frequency products where the most noteworthy for this discussion is the upper and lower sidebands. The upper sideband is formed by adding 947 MHz to the frequency of the second LO. For example, if the frequency of the second LO is set to 1000 MHz, then the frequency of the upper sideband coming from the second mixer is 947 MHz+the frequency of the second LO (1000 MHz) or 1947 MHz. This sideband, which is the unwanted sideband, is filtered out by the 950 MHz lowpass filter 42 and is not seen at the RF output of the upconverter. However, the frequency of the lower sideband, which is the desired sideband, is determined by the frequency of the second LO (1000 MHz)−947 MHz producing an output frequency of 53 MHz which easily passes through the 950 MHz lowpass filter. If the frequency of the second LO is increased to 1807 MHz, then the lower sideband from the second mixer is 860 MHz, which is still able to pass through the 950 MHz lowpass output filter. The output from the 950 MHz lowpass filter is then amplified 19 to obtain the desired output level and then finally sent to the output connector, e.g. 1, 2, 3, ..., N. A small portion of the output power is tapped off by an RF Level detector 44, using a directional coupler, to facilitate power measurement.

The common carrier, multiple output technique operates in the same manner as the conventional upconverter mentioned above with the following exceptions:

In the common carrier system, a single first LO and a single second LO are used to drive each respective upconverter section in a multiple upconverter system. This is accomplished by splitting the LO signal into as many lines as needed to drive the mixer in each section (see FIG. 2). After splitting the LO signal "N" times, the LO cower is reduced and therefore requires amplification to bring the level up as needed by the respective mixer. By splitting both the first and second LO signals in this manner, the number of upconverter sections for a given board size can be increased dramatically.

As discussed above, the LO signal can also be split using directional couplers as shown in FIG. 3. To maintain somewhat consistent LO power along the distribution path, the directional coupler method uses couplers with varying tap values. Couplers closest to the VCO's have the highest tap values (highest tap attenuation) and the couplers closest to the end have the lowest tap values.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A common carrier, multiple output upconverter, comprising:
   a plurality of channels, each channel comprising an upconverter and a downconverter; and
   means for distributing local oscillator (LO) signals from a common first LO and a common second LO to each respective upconverter and downconverter in said plurality of channels.

2. The upconverter of claim 1, wherein said means for distributing comprises a power splitter for splitting signals, respectively, from said common first LO and said common second LO.

3. The upconverter of claim 2, wherein said power splitter comprises a first power splitter coupled to said first LO and a second power splitter coupled to said second LO.

4. The upconverter of claim 2, wherein said power splitter further comprises a plurality of output taps, each tap supplying a respective first LO or second LO signal to a corresponding upconverter and downconverter in a specific one of said plurality of channels, wherein a unique tap is provided for each upconverter and downconverter in each channel.

5. The upconverter of claim 1, wherein said means for distributing comprises a plurality of directional couplers, each directional coupler associated with a respective upconverter or downconverter for a specific one of said plurality of channels, wherein said directional couplers collectively comprise a distributive signal splitting mechanism by which signals from said common first LO and said common second LO are each routed along a respective path to supply respective first LO and second LO signals to each of said plurality of channels.

6. The upconverter of claim 5, wherein each said directional coupler is implemented using circuit board traces in a specific geometric pattern.

7. The upconverter of claim 1, wherein said means for distributing is comprised of a series of hybrid directional couplers that are equally spaced along a signal distribution path.

8. The upconverter of claim 1, wherein said couplers further comprise a plurality of taps having varying tap attenuation values; wherein those couplers that are closest to said first LO and said second LO have a highest tap attenuation value and those couplers that are closest to an end of said distribution path have a lowest tap attenuation value.

9. The upconverter of claim 1, further comprising:
an amplifier stage for amplifying signals from said first LO and said second LO supplied by said means for distributing immediately after splitting to raise said signals to a useful level.

10. The upconverter of claim 9, wherein said amplifying stage comprises a common monolithic microwave integrated circuit.

11. The upconverter of claim 1, further comprising:
one or more attenuators for attenuating signals from said first LO and said second LO supplied by said means for distributing to provide an LO drive level as required for said upconverters and downconverters.

12. A common carrier, multiple output upconversion method, comprising the steps of:
providing a plurality of channels, each channel comprising an upconverter and a downconverter; and
distributing local oscillator (LO) signals from a common first LO and a common second LO to each respective upconverter and downconverter in said plurality of channels.

13. The method of claim 12, said distributing step further comprising the step of providing a power splitter for splitting signals, respectively, from said common first LO and said common second LO.

14. The method of claim 13, wherein said power splitter comprises a first power splitter coupled to said first LO and a second power splitter coupled to said second LO.

15. The method of claim 13, wherein said power splitter further comprises a plurality of output taps, each tap supplying a respective first LO or second LO signal to a corresponding upconverter and downconverter in a specific one of said plurality of channels, wherein a unique tap is provided for each upconverter and downconverter in each channel.

16. The method of claim 12, said distributing step further comprising the step of providing a plurality of directional couplers, each directional coupler associated with a respective upconverter or downconverter for a specific one of said plurality of channels, wherein said directional couplers collectively comprise a distributive signal splitting mechanism by which signals from said common first LO and said common second LO are each routed along a respective path to supply respective first LO and second LO signals to each of said plurality of channels.

17. The method of claim 16, wherein each said directional coupler is implemented using circuit board traces in a specific geometric pattern.

18. The method of claim 12, said distributing step further comprising the step of providing a series of hybrid directional couplers that are equally spaced along a signal distribution path.

19. The method of claim 18, wherein said couplers further comprise a plurality of taps having varying tap attenuation values; wherein those couplers that are closest to said first LO and said second LO have a highest tap attenuation value and those couplers that are closest to an end of said distribution path have a lowest tap attenuation value.

20. The method of claim 12, further comprising the step of:
providing an amplifier stage for amplifying signals from said first LO and said second LO immediately after distributing to raise said signals to a useful level.

21. The method of claim 20, wherein said amplifying stage comprises a common monolithic microwave integrated circuit.

22. The method of claim 12, further comprising:
providing an attenuator for attenuating signals from said first LO and said second LO to provide an LO drive level as required for said upconverters and downconverters.

* * * * *

UNITED STATES PATENT AND TRADEMARK OFFICE
CERTIFICATE OF CORRECTION

PATENT NO. : 6,480,703 B1
DATED : November 12, 2002
INVENTOR(S) : Calderone et al.

It is certified that error appears in the above-identified patent and that said Letters Patent is hereby corrected as shown below:

<u>Title page,</u>
Item [73], Assignee, replace "Agile TV Corporation, Menlo Park, CA (US)" with
-- AgileTV Corporation, Menlo Park, CA (US) --.

Signed and Sealed this

Sixteenth Day of September, 2003

JAMES E. ROGAN
*Director of the United States Patent and Trademark Office*